United States Patent
Kim et al.

(10) Patent No.: US 11,191,196 B2
(45) Date of Patent: Nov. 30, 2021

(54) SOLDERABLE ELECTRIC CONDUCTIVE GASKET

(71) Applicant: JOINSET CO., LTD., Ansan-si (KR)

(72) Inventors: Sun-Ki Kim, Gunpo-si (KR); Tae-Man Kang, Ansan-si (KR); Sung-Ho Cho, Ansan-si (KR); Gyu-Seop Kim, Ansan-si (KR)

(73) Assignee: JOINSET CO., LTD.

( * ) Notice: Subject to any disclaimer, the term of this patent is extended or adjusted under 35 U.S.C. 154(b) by 49 days.

(21) Appl. No.: 16/897,399

(22) Filed: Jun. 10, 2020

(65) Prior Publication Data

US 2020/0396872 A1  Dec. 17, 2020

(30) Foreign Application Priority Data

Jun. 12, 2019 (KR) .................. 10-2019-0069377
May 22, 2020 (KR) .................. 10-2020-0061880

(51) Int. Cl.
*H05K 9/00* (2006.01)
*H05K 3/34* (2006.01)
*H05K 3/30* (2006.01)

(52) U.S. Cl.
CPC .......... *H05K 9/0028* (2013.01); *H05K 3/341* (2013.01); *H05K 9/0015* (2013.01); *H05K 9/0084* (2013.01); *H05K 3/305* (2013.01); *H05K 2201/10371* (2013.01)

(58) Field of Classification Search
CPC ......................... H05K 9/0015; H05K 9/0028
See application file for complete search history.

(56) References Cited

U.S. PATENT DOCUMENTS

| | | | | |
|---|---|---|---|---|
| 5,147,121 A * | 9/1992 | McIlwraith | ............ | H02B 1/16 312/265.4 |
| 5,522,602 A * | 6/1996 | Kaplo | ............ | H05K 9/0015 277/650 |
| 5,712,449 A * | 1/1998 | Miska | ............ | H05K 9/0015 174/356 |
| 5,876,223 A * | 3/1999 | Kaneshige | ............ | H01R 13/24 439/108 |
| 6,116,615 A * | 9/2000 | Trehan | ............ | H05K 9/0015 174/358 |

(Continued)

*Primary Examiner* — Hung V Ngo
(74) *Attorney, Agent, or Firm* — Park & Associates IP Law, P.C.

(57) ABSTRACT

Provided is an electrically conductive solderable gasket configured to be not easily separated or detached from a circuit board by external force after the electrically conductive solderable gasket is mounted on the circuit board by soldering. The gasket includes: a single-body metallic support and an elastic electrical contact terminal which is superposed on an upper portion of the support and into which portions of the support are fitted, wherein the support includes a fixing portion, extensions bent upward from both lengthwise ends of the fixing portion, and first and second fitting portions bent inward respectively from upper ends of the extensions, wherein the first and second fitting portions are fitted into a through-hole of the electrical contact terminal and overlap each other in a state in which a lower surface of a metal layer of the electrical contact terminal is placed in contact with the fixing portion.

14 Claims, 6 Drawing Sheets

(56) References Cited

U.S. PATENT DOCUMENTS

| | | | | |
|---|---|---|---|---|
| 6,255,581 B1* | 7/2001 | Reis | .................. | H05K 3/4015 |
| | | | | 174/388 |
| 7,129,421 B2* | 10/2006 | Reis | .................. | H05K 9/0015 |
| | | | | 174/354 |
| 8,461,455 B2* | 6/2013 | Kim | .................. | H01R 13/2414 |
| | | | | 174/126.2 |
| 2009/0008431 A1* | 1/2009 | Zonvide | .............. | H05K 9/0015 |
| | | | | 228/179.1 |
| 2012/0090885 A1* | 4/2012 | Park | .................. | H05K 9/0015 |
| | | | | 174/358 |
| 2019/0166730 A1* | 5/2019 | Kim | .................. | H05K 9/0015 |

* cited by examiner

SOLDERABLE ELECTRIC CONDUCTIVE GASKET

REFERENCE TO RELATED APPLICATIONS

This application claims the priority benefit of Korean Patent Application No. 10-2019-0069377 filed on Jun. 12, 2019 and Korean Patent Application No. 10-2020-0061880 filed on May 22, 2020, the entire contents of which are incorporated herein by reference.

FIELD OF THE INVENTION

The present invention relates to an electrically conductive solderable gasket, and particularly, to a technique for preventing an electrical contact terminal from being easily separated due to external force after an electrically conductive solderable gasket is mounted on a circuit board by soldering.

In addition, the present invention relates to a technique for reducing the breakage or deformation of an electrical contact terminal caused by repeatedly applied compressive force.

BACKGROUND OF THE INVENTION

Electromagnetic waves generated in circuits of electronic devices or the like are radiated to the outside through air or are conducted through wires. In terms of electronic device design, various electromagnetic waves generated in circuits or the like may cause malfunctions of surrounding electronic devices and may thus result in performance degradation, noise, image distortion, a decrease in device lifespan, defective products, or the like.

In order to prevent such problems caused by electromagnetic waves, electrically conductive solderable gaskets are attached to circuit boards of devices such as cellular phones, liquid crystal device (LCD) monitors, or computers, or attached to antennas, LCD panels, or electronic structures so as to block or electrically ground electromagnetic waves generated from such various electronic devices.

U.S. Pat. No. 7,129,421 discloses an example of such a gasket. The disclosed gasket has a structure in which an electrically conductive material through which a through-hole is formed is supported by a metal support layer, and the support layer is coupled to the electrically conductive material by bending at least one end of the support layer and fitting the at least one end into through-hole.

In the related art, when the electrically conductive material is lifted by external force, the bent portion of the support layer does not sufficiently resist the lifting and thus unfolds or widens, and as a result, there is a drawback in that the electrically conductive material is easily separated from the support layer which is soldered.

For example, the through-hole into which the support layer is bent and fitted is not provided with a structure or adhesive means capable of holding the support layer when the support layer is lifted, such that the support layer may be easily lifted or unfolded by external force, resulting in easy separation of the electrically conductive material. In particular, when the length of the gasket is smaller than the width of the through-hole, the drawback is that the support layer is easily separated.

Specifically, two bent portions (cramp features) of the support layer have the same length and are simply bent once so as to be apart from each other at a center region such that when the gasket is lifted or pushed from a lateral side, the two simply bent portions are easily unfolded or widened to result in easy separation of the gasket. In addition, a portion of the support layer placed in parallel with a lower surface of the gasket is simply flat, and thus there is a drawback in that it is difficult to provide additional merits.

In addition, Korean Patent Registration No. 1033193 discloses an electromagnetic interference (EMI) shielding gasket including: an elastic body which has a hole penetrating lateral surfaces thereof; and an electrode which is partially inserted in the elastic body and is fixed to the elastic body, the electrode being bent along the lateral surfaces and a lower surface of the elastic body, wherein the electrode includes a fixing portion provided in the hole, connection portions bent downward from the fixing portion along the lateral surfaces, and contact portions bent from the connection portions along the lower surface of the elastic body.

When the fixing portion provided in the hole is integrally formed in the gasket, the elastic body is not detached by external force after soldering, but in this case, there is a drawback in that it is difficult to uniformly insert the fixing portion having a relatively large length and an appropriate width while passing the fixing portion through the hole having a relatively small width.

In particular, since the electrode has to be narrower than the hole for ease of manufacturing, the width of the contact portions of the electrode is smaller than the width of the lower surface of the elastic body, thereby resulting in drawbacks such as low soldering strength and shaking or twisting during a reflow soldering process.

In addition, since the contact portions formed outside the hole are apart from each other, there is a drawback in that shaking or twisting occurs largely during a reflow soldering process.

In addition, if both ends of the fixing portion provided in the hole are separable, it is easy to fit the fixing portion, but in this case, drawbacks as in U.S. Pat. No. 7,129,421 arise.

As another technique of the related art, the present inventor's Korean Patent Registration No. 1,001,354 discloses a reflow-solderable electrical contact terminal including: an insulating elastic core in which a through-hole is formed in the length direction thereof; an insulating non-foaming rubber coating layer which surrounds and adheres to the insulating elastic core; and a heat-resistant polymer film which has a surface surrounding and adhering to the insulating non-foaming rubber coating layer and the other surface on which a metal layer is integrally formed, wherein the heat-resistant polymer film is bonded to the insulating non-foaming rubber coating layer with both ends thereof being apart from each other, and a lower surface of the insulating elastic core is inclined from both ends thereof toward a center portion thereof in a concave shape.

The electrical contact terminal is widely used in various applications owing to ease of vacuum pick-up, little shaking or twisting during reflow soldering, direct soldering of the metal layer to solder cream, high soldering strength, and high economical efficiency. However, when the electrical contact terminal is used in a vehicle which frequently wobbles and particularly the electrical contact terminal has a small length, the electrical contact terminal fixed to a circuit board by soldering a lower end portion of the metal layer of the electrical contact terminal to the circuit board using a solder cream is disadvantageous in that external compressive force repeatedly applied to the electrical contact terminal is hardly absorbed in a boundary between the soldered portion of the metal layer and the other non-soldered portion of the metal layer but is repeatedly concentrated in the boundary and may thus lead to the breakage of the metal layer. For example, the soldered portion of the metal layer is not flexible because the soldered portion is combined with a solid solder as one part, and thus it is difficult to transmit external force applied to the soldered portion, thereby resulting in repeated concentration of force at the soldered portion and fracture of the soldered portion of the metal layer.

In addition, since the solder cream causes a lead rising phenomenon in the height direction of the metal layer, the electrical contact terminal has a drawback such as a small push operation length, which makes it difficult to provide a sufficient operation length in a product having a small height, and poor properties such as a poor repetitive-compression recovery rate.

SUMMARY OF THE INVENTION

An object of the present invention is to provide an electrically conductive solderable gasket configured such that an electrical contact terminal may not be easily separated or detached from a support by external force.

Another object of the present invention is to provide an electrically conductive solderable gasket in which repeatedly applied compressive force is not concentrated at a certain portion of a metal layer, thereby reducing breakage or damage at a local portion of the metal layer and increasing the operation length of the electrically conductive solderable gasket.

A further another object of the present invention is to provide an electrically conductive solderable gasket making it possible to stably perform a vacuum pick-up operation and a reflow soldering operation using a solder cream and guarantee sufficient soldering strength.

A still further another object of the present invention is to provide an electrically conductive solderable gasket configured to be easily manufactured and having a simple structure.

An aspect of the present invention provides an electrically conductive solderable gasket including: a single-body metallic support; and an elastic electrical contact terminal which is superposed on the support and into which portions of the support are fitted, wherein the electrical contact terminal includes an elastic core, a polymer film bonded to the support while surrounding the support with an adhesive therebetween, and a metal layer formed on an outer surface of the polymer film, wherein a surface of the electrical contact terminal has a portion for vacuum pickup and is provided according to a soldering temperature, wherein a through-hole extending in a length direction of the core is formed in the core, wherein the support includes a fixing portion, extensions bent upward from both lengthwise ends of the fixing portion, and first and second fitting portions bent inward respectively from upper ends of the extensions, wherein the first and second fitting portions are fitted into the through-hole and overlap each other in a state in which a lower surface of the metal layer is placed in contact with the fixing portion.

Another aspect of the present invention provides an electrically conductive solderable gasket allowing reflow soldering and including: a single-body metallic support; and an elastic electrical contact terminal which is superposed on the support and into which portions of the support are fitted, wherein the electrical contact terminal includes an elastic core, a polymer film bonded to the support while surrounding the support with an adhesive therebetween, and a metal layer formed on an outer surface of the polymer film, wherein a surface of the electrical contact terminal has a portion for vacuum pickup and is provided according to a soldering temperature, wherein a through-hole extending in a length direction of the core is formed in the core, the through-hole has a vertical cross-section which gradually narrows in an upward direction, and fitting grooves are formed at both sides of a bottom of the through-hole, wherein the support includes a fixing portion, extensions bent upward from both lengthwise ends of the fixing portion, and fitting portions bent inward from upper ends of the extensions, wherein the fitting portions are fitted into the fitting grooves in a state in which a lower surface of the metal layer is placed in contact with the fixing portion.

The first fitting portion may be longer than the second fitting portion, and the first fitting portion may overlap the second fitting portion under the second fitting portion. The length of the first fitting portion may be about 60% to about 90% of the length of the through-hole.

The first and second fitting portions may be symmetrical to each other without overlapping each other.

Beads may be formed to protrude from bent portions between the extensions and the first and second fitting portions so as to increase mechanical strength of the bent portions.

The width and length of the fixing portion may be respectively greater than the width and length of the electrical contact terminal.

An adhesive tape may be disposed between overlapping portions of the first and second fitting portions or between the first fitting portion and a bottom of the through-hole.

The through-hole may have a vertical cross-section which gradually narrows in an upward direction.

An opening may be vertically formed through the fixing portion, and the support and the metal layer may be soldered together through the opening.

An upwardly protruding latching portion may be formed on at least a portion of an end portion of the first fitting portion, a latching hole may be formed in a bent portion of the second fitting portion, and the first and second fitting portions may be coupled to each other by bending the second fitting portion to fit and trap the latching portion into the latching hole.

At least a portion of an end portion of the first fitting portion may extend from the through-hole of the electrical contact terminal to form a reinforcing portion, a latching hole may be formed in a bent portion of the second fitting portion, and the first and second fitting portions may be coupled to each other by inserting the reinforcing piece into the latching hole, downwardly bending the reinforce portion, and bending the second fitting portion into the through-hole of the electrical contact terminal.

BRIEF DESCRIPTION OF THE DRAWINGS

The above objects and other advantages of the present invention will become more apparent by describing in detail exemplary embodiments thereof with reference to the attached drawings in which.

DETAILED DESCRIPTION OF THE INVENTION

Technical terms used in the present invention are only for explaining specific embodiments while not limiting the present invention. In addition, unless otherwise defined, technical terms used in the present invention have the same meaning as commonly understood by those of ordinary skill in the art and will not be interpreted in an overly broad or narrow sense.

Hereinafter, specific embodiments of the present invention will be described in detail with reference to the accompanying drawings.

Figure 1:
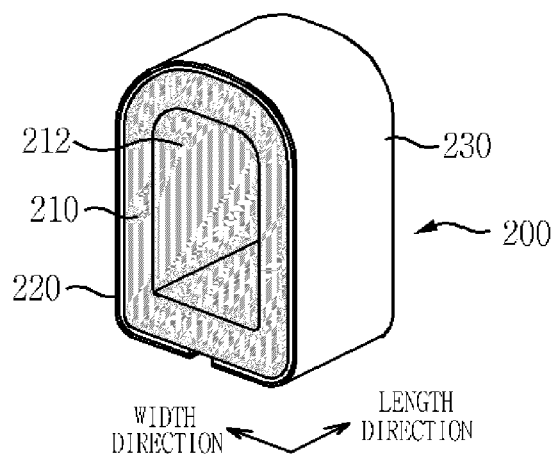
FIG. 1 is an exploded perspective view illustrating an electrically conductive solderable gasket according to an embodiment of the present invention.
Figure 1:
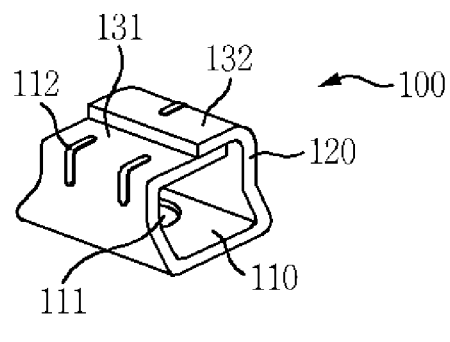
Figure 2A:
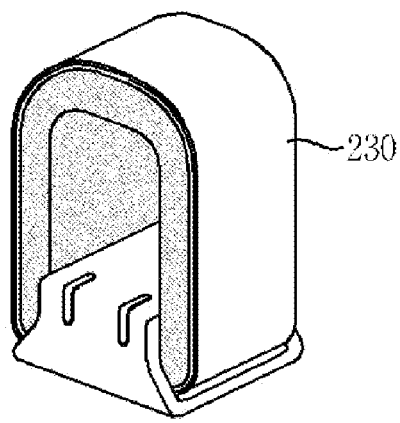
FIGS. 2A and 2B are an assembled perspective view and a vertical cross-sectional view illustrating the electrically conductive solderable gasket.
Figure 2B:
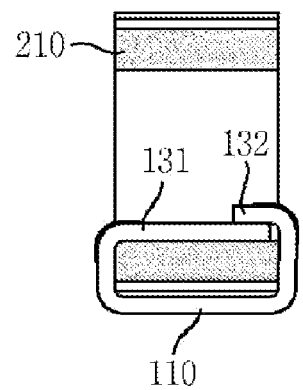
Figure 2C:
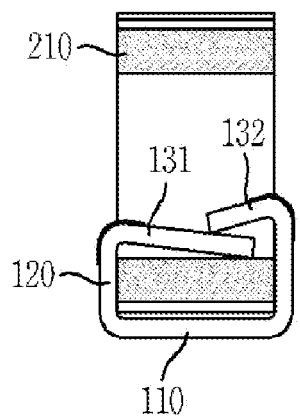
FIG. 2C is a vertical cross-sectional view illustrating the electrically conductive solderable gasket according to another example.

FIG. 1 is an exploded perspective view illustrating an electrically conductive solderable gasket according to an embodiment of the present invention, FIGS. 2A and 2B are an assembled perspective view and a vertical cross-sectional view which illustrate the electrically conductive solderable gasket, and FIG. 2C a vertical cross-sectional view illustrating the electrically conductive solderable gasket according to another example.

The electrically conductive solderable gasket of the present invention includes a metallic support 100 formed in one piece, and an elastic electrical contact terminal 200 which is superposed on an upper portion of the support 100 and into which portions of the support 100 are fitted.

The electrically conductive solderable gasket is reel-taped and vacuum picked up at an upper surface of the electrical contact terminal 200, and a lower surface of the support 100 is brought into contact with solder cream formed on a circuit board so as to be reflow soldered to the circuit board.

Therefore, at least a surface of the electrical contact terminal 200 has a vacuum pick-up portion and is provided according to the temperature of soldering, and as represented in FIG. 1, the electrical contact terminal 200 may have a relatively small length and a relatively great height compared to the width of the electrical contact terminal 200. However, the electrical contact terminal 200 is not limited thereto.

The shape of the solder cream or the material or shape of the support 100 may be appropriately selected or designed such that the solder cream may not come into contact with the electrical contact terminal 200 during reflow soldering.

The coupling strength between the support 100 and the electrical contact terminal 200 is less than the soldering strength of the support 100 to the circuit board on which the support 100 is mounted, and thus if he electrical contact terminal 200 is pulled with a force equal to or greater than a threshold value, the electrical contact terminal 200 may be separated from the support 100.

The dimensions of the support 100 are not particularly limited. However, the support 100 may be as wide as possible so as not be easily lifted by external force, and the area of the lower surface of the support 100 may be equal to or greater than the area of a lower surface of the electrical contact terminal 200 for high soldering strength and easy reflow soldering.

The electrical contact terminal 200 includes an elastic core 210 having a predetermined volume, a polymer film 220 bonded to the core 210 while surrounding the core 210 with an adhesive therebetween, and a metal layer 230 formed on the outer surface of the polymer film 220, and all the elements of the electrical contact terminal 200 have heat resistance against the temperature of soldering.

The metal layer 230 is formed of a material, which can be soldered using the solder cream, such as a material in which a copper layer is plated with tin, silver, or gold.

The inside of the core 210 includes a through-hole 212 extending in the length direction of the core 210, and as described later, the through-hole 212 may have, but is not limited to, a vertical cross-section which gradually narrows in an upward direction.

The cross-sectional shape of the through-hole 212 may be easily varied because the core 210 is manufactured by curing silicone rubber gum corresponding to the core 210 while continuously extruding the silicone rubber gum through an extruder.

In the present embodiment, a lower surface of the core 210 is flat. However, the lower surface of the core 210 may be approximately flat because of tolerances in the manufacturing process of the core 210.

The support 100 may have high strength such that bent portions of the support 100 may not be easily unfolded upward, and the support 100 may be formed of a material, such as inexpensive stainless steel, a copper alloy (for example, phosphor bronze), or an iron alloy, to a thickness of about 0.08 mm to about 0.2 mm. The shape, size, and thickness of the support 100 may be varied depending on the size and shape of the electrical contact terminal 200 and the size of fitting grooves 214.

A plating layer may be formed on the outer surface of the support 100 for ease of soldering by using the solder cream, and for example, the outer surface of the support 100 may be plated with tin, nickel-tin, or silver.

The support 100 may be manufactured by pressing and bending metal foil which has a constant width and is coated with a plating layer, and when the support 100 is formed of stainless steel, a plating layer is not formed on a pressed cut section of the support 100 such that molten solder may not rise along the cut section.

In the present embodiment, the support 100 includes a fixing portion 110, extensions 120 bent upward from both lengthwise ends of the fixing portion 110, and fitting portions 130 bent inward from ends of the extensions 120.

An opening 111 may be formed in the fixing portion 110.

Since the opening 111 is formed in the fixing portion 110, if the solder cream is provided on the circuit board at a position corresponding to the opening 111, the solder cream rises through the opening 111 during a surface mounting process, and thus the support 100 and the metal layer 230 of the electrical contact terminal 200 are soldered together, thereby providing stable electrical contact and preventing the electrical contact terminal 200 from being easily separated from the support 100.

In addition, if the solder cream is not provided on the circuit board at a position corresponding to the opening 111, the fixing portion 110 and the metal layer 230 are not soldered together, and in this case, the core 210 can be slightly moved on the support 100 by external force such that it may be possible to prevent the concentration of external force at a local position and minimize damage to the metal layer 230 at the local position, thereby guaranteeing more reliable electrical connection.

The opening 111 may be a circular hole formed in a center portion of the fixing portion 110 as in the present embodiment, but is not limited thereto.

The opening 111 may have a shape and dimensions for minimizing shaking or twisting of the electrically conductive solderable gasket during a reflow soldering process.

The fitting portions 130 include: a relatively long fitting portion 131 (hereinafter referred to as a first fitting portion 131) and a relatively short fitting portion 132 (hereinafter referred to as a second fitting portion 132), and the first and second fitting portions 131 and 132 overlap each in a state in which the first fitting portion 131 is below the second fitting portion 132.

Adhesive tape may be disposed between overlapping portions of the first and second fitting portions 131 and 132 or between the first fitting portion 131 and the bottom of the through-hole 212, and the core 210 formed of a rubber material stretches well, such that when the core 210 is lifted by external force, the adhesive tape may also stretch to minimize unfolding of the first fitting portion 131.

The length of the first fitting portion 131 may be about 60% to about 90% of the length of the through-hole 212, and the length of the second fitting portion 132 may be designed such that the first and second fitting portions 131 and 132 may overlap each other.

Unlike in this embodiment, the first fitting portion 131 and the second fitting portion 132 may overlap each other while having the same length, and in this case, the length of each of the first and second fitting portions 131 and 132 may be equal to or greater than half the length of the through-hole 212.

In the present embodiment, the area of the fixing portion 110 is greater than the area of the lower surface of the electrical contact terminal 200, but the width of portions of the extensions 120 and the width of the fitting portions 130 are relatively narrow for being fitted into the through-hole 212 of the core 210 because the width of the through-hole 212 of the electrical contact terminal 200 cannot be greater than the width of the lower surface of the electrical contact terminal 200.

The extensions 120 are bent 90 degrees from the fixing portion 110 for contact with end surfaces of the electrical contact terminal 200, and the fitting portions 130 are horizontally bent from the extensions 120. However, as described later, the extensions 120 may be bent at an acute angle from the fixing portion 110 or the fitting portions 130 may be bent at an acute angle from the extensions 120 to form downward slopes.

Therefore, the extensions 120, which connect the fixing portion 110 of the support 100 to the fitting portions 130 of the support 100, may have a taper shape with an upwardly decreasing width or may have a shape with a stepped middle portion.

Referring to FIGS. 2A and 2B, the electrically conductive solderable gasket is provided by fitting the first and second fitting portions 131 and 132 into the through-hole 212 in a state in which the lower surface of the electrical contact terminal 200 is placed on the fixing portion 110 of the support 100.

The lower surface of the electrical contact terminal 200 and an upper surface of the fixing portion 110 are brought into contact with each other in a flat plane to reduce shaking during reflow soldering and guarantee left-right balance after the reflow soldering.

For example, the lower surface of the support 100 is fixed to the circuit board through a soldering process using the solder cream, and in this state, if the electrical contact terminal 200 is lifted by external force, the external force is generally distributed to two regions.

That is, the external force is distributed to the first fitting portion 131 to cause the first fitting portion 131 having a relatively large length to escape from the second fitting portion 132 superposed on an upper portion of the first fitting portion 131 in the through-hole 212, and to bent portions between the extensions 120 and the first and second fitting portions 131 and 132.

As a result, owing to this external force distribution structure, external force may be prevented from concentrating at one position but may be distributed to various positions, such that the electrical contact terminal 200 may not be easily separated by external force acting to unfold the first and second fitting portions 131 and 132.

In particular, when the support 100 and the electrical contact terminal 200 are soldered together through the opening 111 as described above, there is an advantage in that the support 100 and the electrical contact terminal 200 are not be easily separated from each other owing to the soldering even in the case in which the bent portions are unfolded.

In this regard, protruding beads 12 may be formed centered on the bent portions between the extensions 120 and the first and second fitting portions 131 and 132 of the support 100, in order to increase the mechanical strength of the bent portions and thus to prevent the bent portions from being easily unfolded.

According to the present invention, soldering may be performed only on the lower surface of the support 100, and the metal layer 230 of the electrical contact terminal 200 may not be soldered.

In other words, although the metal layer 230 of the electrical contact terminal 200 is formed of a reflow-solderable material which can be soldered using the solder cream formed on a conductive pattern of the circuit board, the solder cream printed on the conductive pattern of the circuit board can be prevented from making contact with the metal layer 230 of the electrical contact terminal 200 during reflow soldering by properly designing the size or shape of a solder pattern or the material or structure of the support 100, and thus, the metal layer 230 may not be soldered.

According to this structure, when downward external force is repeatedly applied to the electrically conductive solderable gasket soldered to the circuit board, since the electrical contact terminal 200 does not have a soldered portion, compressive force may not be concentrated at a certain portion but may be relatively uniformly distributed, thereby minimizing damage to the metal layer 230 such as local cracking or cutting.

Therefore, the electrical contact terminal 200 may smoothly connect electricity between the circuit board and a conductive target object.

In addition, referring to FIG. 2C, although the bent portions between the extensions 120 and the first and second fitting portions 131 and 132 are located outside the through-hole 212, since the first and second fitting portions 131 are 132 are bent at acute angles at the bent portions, the bent portions may strongly resist external force acting to lift the electrical contact terminal 200, and thus separation of the electrical contact terminal 200 from the support 100 may be minimized.

Figure 3A:
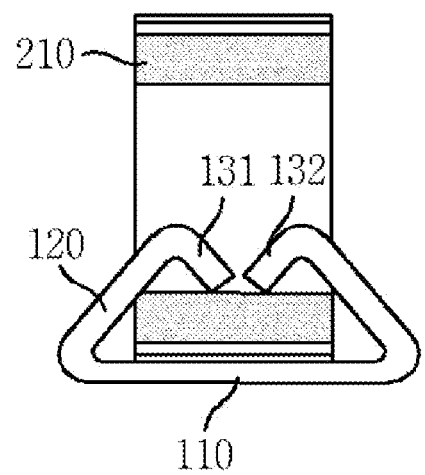
FIGS. 3A and 3B are views illustrating different examples of a support.
Figure 3B:
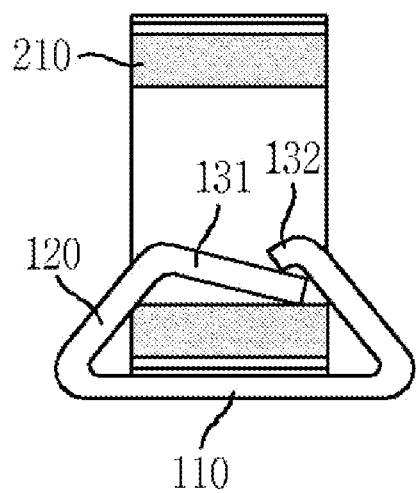

FIGS. 3A and 3B illustrate different examples of the support 100.

Referring to FIG. 3A, unlike the above-described embodiment, the extensions 120 make an acute angle of about 90 degrees or less with the fixing portion 110 and extend upwardly into the through-hole 212 such that the bent portions between the extensions 120 and the first and second fitting portions 131 and 132 are located inside the through-hole 212, and the first and second fitting portions 131 and 132 have an acute angle at the bent portions and extend downward in a symmetrical manner without overlapping each other.

According to this structure, the bent portions between the extensions 120 and the first and second fitting portions 131 and 132 strongly resist external force acting to lift the electrical contact terminal 200, thereby minimizing separation of the electrical contact terminal 200 from the support 100.

FIG. 3B illustrates the same structure as that shown in FIG. 3A except that the first fitting portion 131 has a relatively large length and overlaps the second fitting portion 132 under the second fitting portion 132.

Owing to the overlapping structure, the bent portions may more strongly resist external force acting to lift the electrical contact terminal 200, thereby minimizing separation of the electrical contact terminal 200 from the support 100.

Figure 4A:
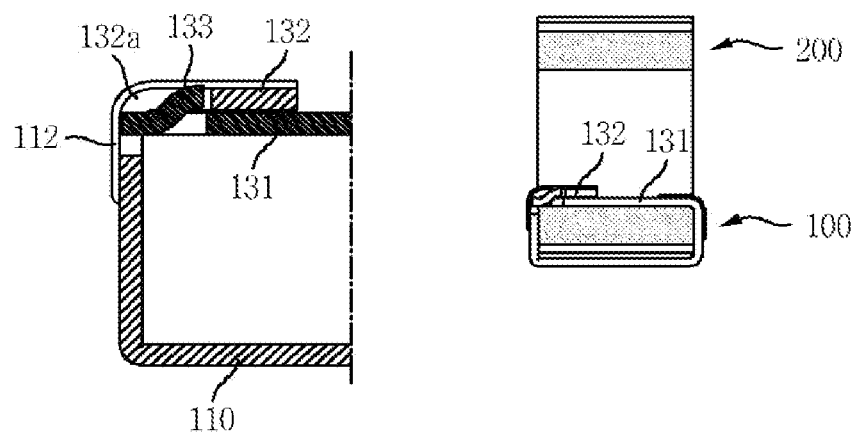
FIGS. 4A and 4B are views illustrating other examples of the electrically conductive solderable gasket and the support on an enlarged scale.
Figure 4B:
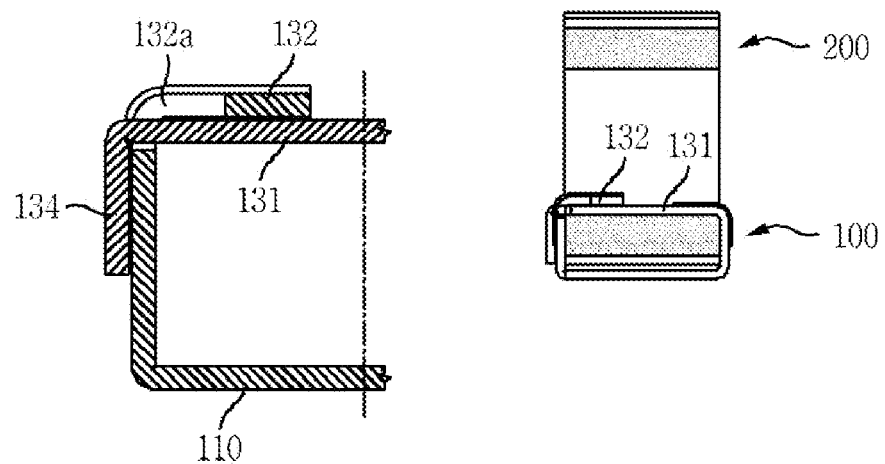

FIGS. 4A and 4B illustrate other examples of the electrically conductive solderable gasket and the support 100 on an enlarged scale.

Unlike in the above embodiments, the first and second fitting portions 131 and 132 of the support 100 has a physically coupling structure in the embodiments shown in FIGS. 4A and 4B.

Referring to FIG. 4A, a latching portion 133 is formed by upwardly pressing a portion of an end portion of the first fitting portion 131, and a latching hole 132a is formed in the bent portion of the second fitting portion 132.

According to this structure, the first and second fitting portions 132 are coupled to each other as the second fitting portion 132 is bent to fit and trap the latching portion 133 of the first fitting portion 131 into the latching hole 132a, and thus even when the electrical contact terminal 200 is lifted, the second contact portion 132 is not easily separated owing to the latching portion 133 fitted into the latching hole 132a, thereby making it difficult to lift the electrical contact terminal 200.

Referring to FIG. 4B, a reinforcing portion 134 is formed by a portion of an end portion of the first fitting portion 131 which extends from the through-hole 212 of the electrical contact terminal 200.

Therefore, the reinforcing portion 134 of the first fitting portion 131 is inserted into the latching hole 132a formed in the bent portion of the second fitting portion 132 and is bent downward, and the second fitting portion 132 is bent into the through-hole 212.

As a result, since end portions of the first and second fitting portions 131 and 132 are bent while overlapping each other through the latching hole 132a, even when the electrical contact terminal 200 is lifted, the first and second fitting portions 131 and 132 operate as if the first and second fitting portions 131 and 132 hold each other, thereby making it difficult to lift the electrical contact terminal 200.

Unlike in this embodiment, the same effect may be obtained by forming a latching hole in the first fitting portion 131.

Figure 5:
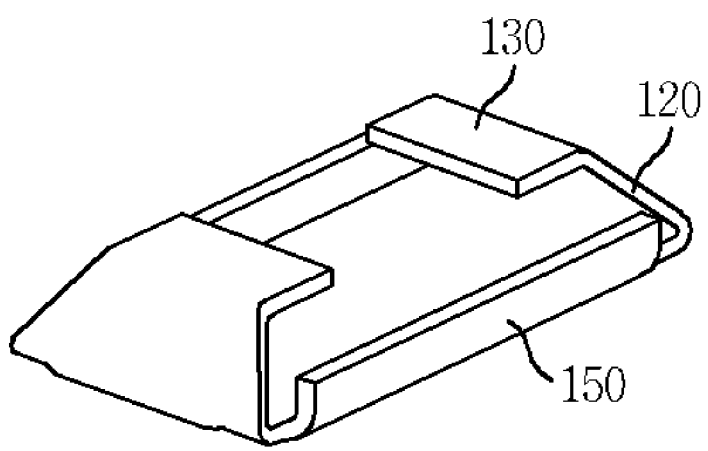
FIG. 5 is a view illustrating the support according to another embodiment.

FIG. 5 illustrates the support 100 according to another embodiment.

According to this embodiment, soldering prevention walls 150 which protrude upward from both widthwise ends of the fixing portion 110 and extend in the length direction of the fixing portion 110 is formed in one piece with the fixing portion 110.

The soldering prevention walls 150 may have a height such that even when the area of the solder cream is large, the rise of molten solder may be prevented during soldering.

Owing to the soldering prevention walls 150, it is possible to more reliably prevent molten solder from rising upward along the metal layer 230 of the electrical contact terminal 200 during soldering, and when the molten solder is attached to the soldering prevention walls 150, the strength of soldering may increase.

In addition, even when external force is applied to the electrical contact terminal 200, the lower surface of the electrical contact terminal 200 may be deformed within the inside of the soldering prevention walls 150, and thus the shape of the electrical contact terminal 200 may be relatively stably maintained.

FIGS. 6A to 6D illustrate other examples of the electrical contact terminal 200.

In these embodiments, the fitting portions 130 may overlap each other or may not overlap each other as in the above-described embodiments.

Figure 6A:
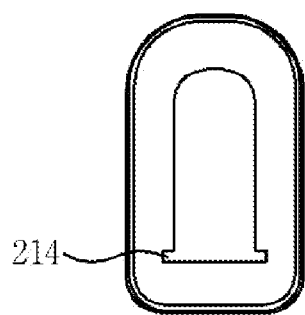
FIGS. 6A to 6D are views illustrating other examples of an electrical contact terminal.

Referring to FIG. 6A, the through-hole 212 is formed in the core 210 to extend in the length direction of the core 210, and horizontal fitting grooves 214 are formed at both sides of the bottom of the through-hole 212.

According to this structure, since the fitting portions 130 of the support 100 are fitted into the fitting grooves 214 and held by ceiling walls of the fitting grooves 214, it is helpful to prevent upward unfolding of the fitting portions 130.

Figure 6B:
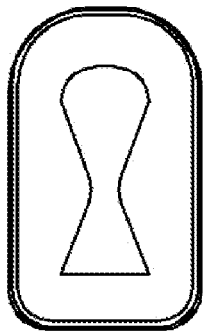

Referring to FIG. 6B, the through-hole 212 has a hourglass-shaped cross section to prevent lifting of the fitting portions 130 of the support 100, and thus unfolding of the fitting portions 130 may be prevented to some degree.

Figure 6C:
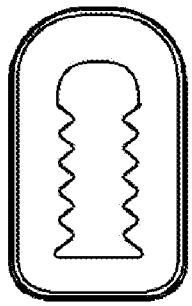
Figure 6D:
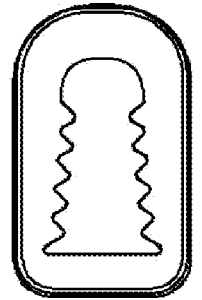

Referring to FIGS. 6C and 6D, serrate stop jaws are formed on both sides of the through-hole 212, and thus lifting of the fitting portions 130 of the support 100 may be prevented to some degree. In particular, referring to FIG. 6D, the widthwise gap between the stop jaws gradually narrows, and thus movement of the fitting portions 130 may be more securely prevented.

The shapes and dimensions of the fitting portions 130 may be varied depending on the shape and dimensions of the support 100.

According to the present invention, unfolding or widening of the fitting portions 130 of the support 100 can be minimized by overlapping the fitting portions 130 of the support 100 or downwardly inclining the fitting portions 130 of the support 100, and thus the phenomenon in which the electrical contact terminal 200 is easily detached or separated from the support 100 can be minimized.

In particular, since the beads 12 protrude from the bent portions between the fixing portion 110 and the extensions 120 of the support 100 and/or between the extensions 120 and the fitting portions 130 of the support 100, the mechanical strength of the bent portions can be increased to prevent the bent portions from being easily unfolded by external force.

In addition, only the support 100 may be soldered without soldering the metal layer 230 of the electrical contact terminal 200, and in this case, the electrical contact terminal 200 can be moved on the support 100 with a clearance therebetween when external contact force is repeatedly applied to the electrical contact terminal 200, thereby preventing concentration of compressive force at one position of the metal layer 230, enabling substantially uniform distribution of compressive force, and minimizing damage to a local portion of the metal layer 230.

In addition, the support 100 and the metal layer 230 may be soldered to each other through the opening 111, and in this case, even when the support 100 is unfolded or widened by external force, the support 100 and the electrical contact terminal 200 may not be easily separated from each other owing to the soldering.

In addition, the fixing portion 100 having dimensions similar to or greater than the width and length of the lower surface of the electrical contact terminal 200 may guarantee a soldering process in which reflow easily occurs during soldering, and when the fixing portion 110 has the opening 111, the fixing portion 110 may guarantee a more reliable reflow soldering process.

In addition, the shapes of the through-hole 212, the support 100, the fitting portions 130, and the opening 111 of the electrically conductive solderable gasket may be efficiently varied such that the electrically conductive solderable gasket may guarantee a surface mounting process using vacuum pick-up and a stable reflow soldering process.

While the present invention has been described according to the embodiments, those of ordinary skill could understand that various modifications can be made in the embodiments. Therefore, the scope of the present invention should not be limited to the above-described embodiments and should be defined by the following claims.

What is claimed is:

1. An electrically conductive solderable gasket comprising a single-body metallic support and an elastic electrical contact terminal which is superposed on the support and into which portions of the support are fitted,
    wherein the electrical contact terminal comprises an elastic core,
    wherein a through-hole extending in a length direction of the core is formed in the core,
    wherein the support comprises a fixing portion, extensions bent upward from both lengthwise ends of the fixing portion, and first and second fitting portions bent inward respectively from upper ends of the extensions,
    wherein the first and second fitting portions are fitted into the through-hole and overlap each other in a state in which a lower surface of the electrical contact terminal is placed in contact with the fixing portion.

2. The electrically conductive solderable gasket of claim 1, wherein the length of the first fitting portion and the length of the second fitting portion are same.

3. The electrically conductive solderable gasket of claim 1, wherein the electrical contact terminal comprises a polymer film bonded to the core while surrounding the core with an adhesive therebetween, and a metal layer formed on an outer surface of the polymer film,
    wherein a surface of the electrical contact terminal has a portion for vacuum pickup and is provided according to a soldering temperature.

4. The electrically conductive solderable gasket of claim 1, wherein beads are formed to protrude from bent portions between the extensions and the first and second fitting portions so as to increase mechanical strength of the bent portions.

5. The electrically conductive solderable gasket of claim 1, wherein both widthwise ends of the fixing portion further extend upward.

6. The electrically conductive solderable gasket of claim 1, wherein the first and second fitting portions are bent downward from the extensions while forming acute angles with the extensions.

7. The electrically conductive solderable gasket of claim 6, wherein bent portions between the first and second fitting portions and the extensions are located inside the through-hole.

8. The electrically conductive solderable gasket of claim 6, wherein the first and second fitting portions are symmetrical to each other.

9. The electrically conductive solderable gasket of claim 1, wherein the support prevents a soldered portion by soldering from forming on the electrical contact terminal.

10. The electrically conductive solderable gasket of claim 9, wherein when external force is applied to the electrical contact terminal, a stress by the soldered portion is not provided on the electrical contact terminal, thereby minimizing local cracking of the electrical contact terminal.

11. The electrically conductive solderable gasket of claim 1, wherein an upwardly protruding latching portion is formed on at least a portion of an end portion of the first fitting portion,
    a latching hole is formed in a bent portion of the second fitting portion, and
    the first and second fitting portions are coupled to each other by bending the second fitting portion to fit and trap the latching portion into the latching hole.

12. The electrically conductive solderable gasket of claim 1, wherein at least a portion of an end portion of the first fitting portion extends from the through-hole of the electrical contact terminal to form a reinforcing portion,
    a latching hole is formed in a bent portion of the second fitting portion, and
    the first and second fitting portions are coupled to each other by inserting the reinforcing piece into the latching hole, downwardly bending the reinforce portion, and bending the second fitting portion into the through-hole of the electrical contact terminal.

13. An electrically conductive solderable gasket allowing reflow soldering and comprising: a single-body metallic support; and an elastic electrical contact terminal which is superposed on the support and into which portions of the support are fitted,
    wherein the electrical contact terminal comprises an elastic core,
    wherein a through-hole extending in a length direction of the core is formed in the core, and fitting grooves are formed at both sides of a bottom of the through-hole,
    wherein the support comprises a fixing portion, extensions bent upward from both lengthwise ends of the fixing portion, and first and second fitting portions bent inward respectively from upper ends of the extensions,
    wherein the first and second fitting portions are fitted into the through-hole in a state in which a lower surface of the electrical contact terminal is placed in contact with the fixing portion,
    wherein a width and length of the fixing portion may be respectively greater than the width and length of the electrical contact terminal.

14. An electrically conductive solderable gasket allowing reflow soldering and comprising: a single-body metallic support; and an elastic electrical contact terminal which is superposed on the support and into which portions of the support are fitted,
    wherein the electrical contact terminal comprises an elastic core,
    wherein a through-hole extending in a length direction of the core is formed in the core, the through-hole has a vertical cross-section which gradually narrows in an upward direction, and fitting grooves are formed at both sides of a bottom of the through-hole, wherein the support comprises a fixing portion, extensions bent upward from both lengthwise ends of the fixing portion, and fitting portions bent inward from upper ends of the extensions, wherein the fitting portions are fitted into the fitting grooves in a state in which a lower surface of the electrical contact terminal is placed in contact with the fixing portion.

\* \* \* \* \*